Jan. 24, 1961 H. B. VOELCKER, JR 2,969,183

POSITIVE FEEDBACK ELECTRONIC INTEGRATOR AND DIFFERENTIATOR CIRCUITS

Filed May 6, 1958

INVENTOR,
HERBERT B. VOELCKER JR.

BY

Harry M. Saragovitz

ATTORNEY

United States Patent Office 2,969,183
Patented Jan. 24, 1961

2,969,183

POSITIVE FEEDBACK ELECTRONIC INTEGRATOR AND DIFFERENTIATOR CIRCUITS

Herbert B. Voelcker, Jr., Tonawanda, N.Y., assignor to the United States of America as represented by the Secretary of the Army Filed May 6, 1958, Ser. No. 733,454

9 Claims. (Cl. 235—183)

(Granted under Title 35, U.S. Code (1952), sec. 266)

The invention described herein may be manufactured and used by or for the Government for governmental purposes, without the payment of any royalty thereon.

This invention relates to electrical circuits and more particularly to improved integration and differentiation circuits.

In electronic analog computers or other systems, such as those which require sinusoidal signals in exact quadrature, it is often required to differentiate or integrate accurately time-varying electrical signals. While various types of such circuits are well known, none have provided the ideal differentiation or integration which is always desired, although close approximations to the required mathematical operations have been obtained. In prior art integrators and differentiators, accurate computation usually required high gain amplifiers which resulted in relatively large units and concomitant instability problems.

It is therefore an object of the present invention to provide electronic circuits for effecting differentiation and integration in which the disadvantages referred to are avoided.

It is another object of the present invention to provide electronic circuits for accurately differentiating and integrating time-varying signals which lie within four to five decade dynamic range of the circuit.

It is yet another object of the present invention to provide electronic circuits wherein accurate differentiation and integration of time-varying signals is achieved by means of a regenerative feedback loop.

In accordance with the present invention means are provided for generating a voltage which is a mathematical function of a source of input voltage. Included are first, second and third impedances connected in series in that order across the input source, the second and third impedances being of equal value and having phase quadrature characteristics with respect to said first impedance. In addition, there is provided a pair of output terminals connected across the third impedance and a regenerative feedback loop coupled between the junction of the second and third impedances and the junction of the first and second impedances. The feedback loop comprises: an amplifier circuit having its input connected to the junction of the second and third impedances and a fourth impedance, equal to and characterized by the same electrical parameters as that of the first impedance, connected between the output of the amplifier circuit and the junction of the first and second impedances. The amplifier circuit is adapted to provide an amplification factor of 4.

In one embodiment of the present invention, there is provided an electrical integrating circuit which includes a source of input voltage and a first resistor and a first and second capacitor having the same capacitance value connected in series in that order across the input source. Also provided are means for deriving an output voltage across the second capacitor and a regenerative feedback loop including an amplifier responsive to the output voltage and a second resistor connected between the output of the amplifier and the junction of the first resistor and first capacitor. The amplifier is adapted to provide an amplification factor of 4 and the second resistor is of the same value as the first resistor.

In another embodiment of the present invention, there is provided an electrical differentiating circuit which includes a source of input voltage, and a first capacitor and a first and second resistor having the same resistance value connected in series in that order across the input source. Also provided are means for deriving an output voltage across the second resistor and a regenerative feedback loop including an amplifier responsive to the output voltage and a second capacitor connected between the output of the amplifier and the junction of the first capacitor and first resistor. The amplifier is adapted to provide an amplification factor of 4 and the second capacitor has the same capacitance value as that of the first capacitor.

For a better understanding of the present invention together with other and further objects thereof, reference is had to the following description taken in connection with the accompanying drawings in which.

In Laplacian operator form, the transfer function of a perfect RC differentiating circuit is $$\frac{e_o(s)}{e_i(s)}=RCs \qquad (1)$$

and the transfer function of a prefect integrating circuit is $$\frac{e_o(s)}{e_i(s)}=\frac{1}{RCs} \qquad (2)$$

Figures 1, 2, 3:
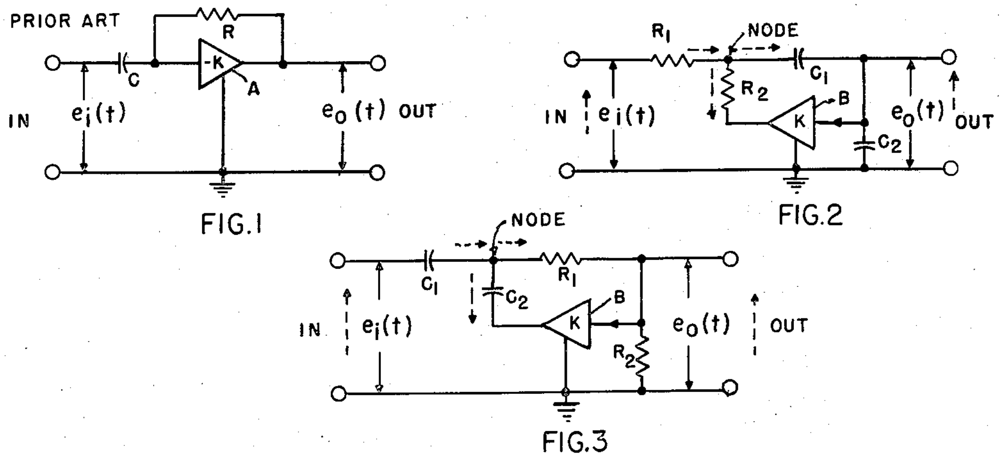
Fig. 1 is a schematic representation of the prior art.
Fig. 2 is a schematic representation of the improved integrating circuit in accordance with my invention.
Fig. 3 is a schematic representation of the improved differentiating circuit in accordance with my invention.

Electronic differentiating circuits which already exist in the prior art but which provide only an approximation of the ideal transfer function shown in Equation 1 may be generalized by the type of circuit shown in Fig. 1 wherein the input voltage $e_i(t)$ is supplied through capacitor C to the input of the parallel arrangement comprising resistor R and an amplifier A having an amplification factor of (—K). As shown, degenerative feedback is provided from the output of amplifier A to the input thereof through resistor R and the differentiated output voltage $e_o(t)$ is derived across the output of degenerative amplifier A. It can be shown that the transfer function of this circuit in Laplacian operator form is $$\frac{e_o(s)}{e_i(s)}=\frac{-\left[\frac{K}{K+1}\right]RCs}{\left[\frac{RC}{K+1}\right]s+1} \qquad (3)$$

As is well known, the circuit shown in Fig. 1 will provide an output voltage $e_o(t)$ which is approximately an integral of the input voltage $e_i(t)$ if the capacitor C and the resistor R are interchanged. The transfer function of such an integrating circuit in Laplacian operator form is $$\frac{e_o(s)}{e_i(s)}=\frac{-\left[\frac{K}{K+1}\right]}{RCs+\left[\frac{1}{K+1}\right]} \qquad (4)$$

The derivation of the transfer functions of Equations 3 and 4 are predicated on the following assumptions:

(*a*) The circuit is not affected by the impedance of the input source or the output sink;

(*b*) The circuit is not affected by the input and output impedances of amplifier A, and (*c*) All elements of the circuit operate within their linear range. From Equations 3 and 4 it can be seen that the respective transfer functions approach that of a perfect RC differentiator and a perfect RC integrator when the negative gain K is made very large. In both cases, regardless of the magnitude of the gain K, some error in the resultant integrated or differentiated signal always exists due to the impossibility of removing the pole term in the denominator of each of the transfer functions derived in Equations 3 and 4.

Reference is now made to Figs. 2 and 3 which show the improved circuitry in accordance with the present invention. Fig. 2 illustrates the improved integrating circuit and Fig. 3 illustrates the improved differentiating circuit. It is to be noted that both circuits are identical except that the capacitor components and resistor components of one circuit are interchanged with the resistor components and the capacitor components, respectively, of the other circuit. The integrating circuit of Fig. 2 is a two-terminal pair network which includes a resistor $R_1$ and two capacitors $C_1$ and $C_2$, of equal value, connected in series in that order across the input circuit. Connected across capacitor $C_1$ is a regenerative or positive feedback loop which includes a linear amplifier B having an amplification factor $K=+4$ and a resistor $R_2$ equal in value to resistor $R_1$. As shown, the output voltage, $e_o(t)$, of the network is derived across capacitor $C_2$ and this voltage output is also fed back without inversion through amplifier B and resistor $R_2$ to the junction of capacitor $C_1$ and resistor $R_1$. The differentiating circuit of Fig. 3 is identical to that of Fig. 2, except that the resistors and capacitors are interchanged. Thus, in Fig. 3, capacitor $C_1$ and the two equal value resistors $R_1$ and $R_2$ are connected in series in that order across the input circuit, and the regenerative or positive feedback loop including amplifier B and capacitor $C_2$ is connected across resistor $R_1$. The voltage output $e_o(t)$ of the differentiating circuit is derived across resistor $R_2$ and the regenerative feedback loop applies this output voltage to the junction of capacitor $C_1$ and resistor $R_1$ without inversion. Under the assumptions that; (*a*) all passive and active linear elements are assumed to operate within their linear ranges; (*b*) the impedance level at the input to the integrating network is zero; (*c*) the impedance level at the output of the integrating network is infinitely large compared to $R_2=R_1$, and (*d*) the input impedance and output impedance of amplifier B are respectively much greater than $R_1=R_2$ and much smaller than $R_1=R_2$; then the circuit shown in Fig. 2 will function as an ideal integrator whose transfer function is $$\frac{e_o(s)}{e_i(s)}=\frac{1}{RCs}$$

and the circuit shown in Fig. 3 will function as an ideal differentiator whose transfer function $$\frac{e_o(s)}{e_i(s)}=RCs$$

This can be shown as follows for the integrating circuit of Fig. 2. Under the assumptions hereinabove described and the nodal currents assumed as shown by the dotted arrows, the nodal equation of the network of Fig. 2 in Laplacian operator form is $$\frac{e_i(s)-2e_o(s)}{R}=\frac{2e_o(s)-Ke_o(s)}{R}+\frac{Cse_o(s)}{1} \qquad (5)$$

where $R=R_1=R_2$ and $C=C_1=C_2$.

From Equation 5 we have $$e_i(s)=4e_o(s)-Ke_o(s)+RCse_o(s) \qquad (6)$$

and the transfer function resulting from Equation 6 is $$\frac{e_o(s)}{e_i(s)}=\frac{1}{RCs+(4-K)}$$

From Equation 6, it can be seen that to allow the circuit of Fig. 2 to operate as an ideal integrator modified only by the RC constant, the value of K, i.e., the amplification factor, must be adjusted to +4. Hence, if the amplification factor of the feedback amplifier is adjusted to a value of +4, the pole in the idealized transfer function is completely cancelled. Similarly, assuming the nodal currents shown by the dotted arrows in the differentiating circuit of Fig. 3, the nodal equation of this network in Laplacian form is $$[e_i(s)-2e_o(s)]Cs=\frac{e_o(s)}{R}+[2e_o(s)-Ke_o(s)]Cs \qquad (7)$$

where $R=R_1=R_2$ and $C=C_1=C_2$.

From Equation 7 we have $$Cse_i(s)=\frac{e_o(s)}{R}+4Cse_o(s)-KCse_o(s) \qquad (8)$$

and hence the transfer function of the differentiating circuit of Fig. 3 is $$\frac{e_o(s)}{e_i(s)}=\frac{RCs}{RC(4-K)s+1} \qquad (9)$$

From Equation 9, it can be seen that to allow the circuit of Fig. 3 to operate as an ideal differentiator, i.e., with a transfer function of RC*s*, the value of K must be adjusted to +4. By such an arrangement, the pole in the denominator of the idealized transfer function is completely cancelled.

Figure 4:
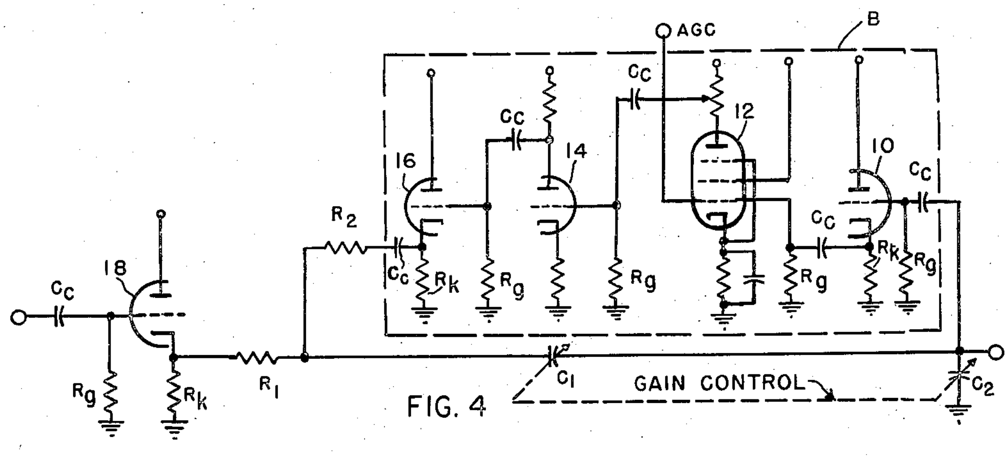
Figs. 4 and 5 are schematic representations of practical integrating and differentiating circuits incorporating the principles of the present invention.

Fig. 4 illustrates a practical integrator circuit in accordance with my invention which satisfies the impedance requirements hereinabove mentioned. Referring now to Fig. 4, where like reference letters refer to like components, the amplifier circuit comprises an input cathode follower 10, a pentode voltage amplifier 12, a phase inverter tube 14 and an output cathode follower 16, and the time varying voltage $e_i(t)$ is applied to the input of the integrating circuit through a cathode follower 18. The amplifier circuit arrangement provides an amplified output which is in phase with the input voltage applied thereto. It is to be noted the cathode followers 12, 14 and 18, each have a cathode resistor of the same value, $R_k$, and that the input and output coupling capacitors of the amplifier components and that of the grid coupling capacitor of cathode follower 18 are of the same value, $C_c$. It is to be noted also that the grid resistors of the amplifier components and that of cathode-follower 18 are of the same value, $R_g$. If $R_1=R_2>>R_k$, and $R_g>>R_1=R_2$ and $C_c>>C_1=C_2$, then all the impedance requirements set forth above are met. It is to be understood of course that other suitable circuits can readily be designed to achieve the same impedance requirements. In Fig. 4, an AGC signal is shown applied to the grid of pentode voltage amplifier 12. This AGC input may be used to maintain K substantially equal to 4. Where the input signals are sinusoidal or have predictable characteristics, a suitable error correction circuit may be used to control the AGC signal such that the amplification factor of the amplifier circuit B is maintained substantially equal to 4. In the case of sinusoidal input signals, the integrator circuit will introduce an almost 90-degree phase lag when operating properly so that any small error in K will introduce a phase-shift error in the output of the integrator circuit. By comparing the output and input of the integrator, this error can be corrected by well known means to derive a direct current AGC signal proportional to the phase error for maintaining K substantially equal to 4. This form of feedback error correction is also applicable when the input signal has a predictable characteristic, e.g., a carrier frequency component which can be separated from random signal components.

Figure 5:
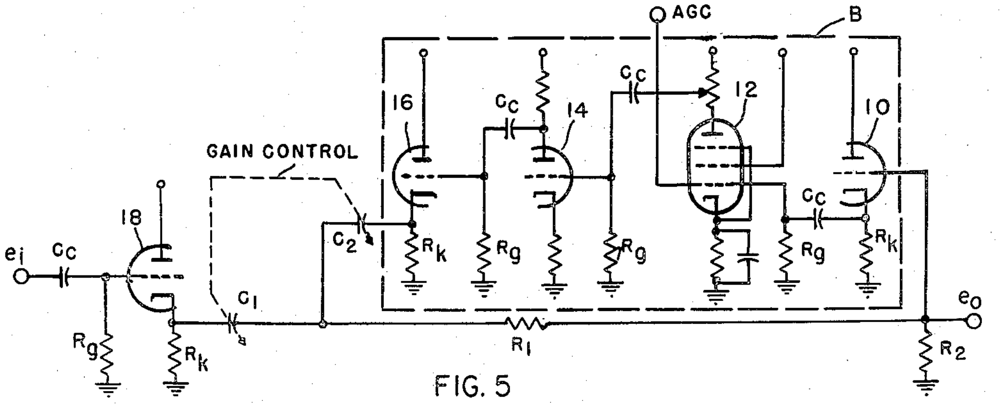

Fig. 5 illustrates a practical differentiator circuit having the same components as in Fig. 4 to meet the assumed impedance requirements. As in the integrating circuit, $R_1=R_2>>R_k$, $R_g>>R_1=R_2$ and $C_c>>C_1=C_2$. Since the output of the differentiator circuit introduces an almost 90-degree phase lead in a sine wave, the AGC voltage can be controlled in the same manner as described in connection with Fig. 4 to maintain K substantially equal to 4. This of course holds true for sinusoidal signals or other signals having predictable characteristics. Again, as an example of the latter case, the input signals may comprise random information signals modulated with a known carrier so that the carrier may be used to control the AGC signal to insure proper circuit operation. The gain control provided by the ganged connection in both Fig. 4 and Fig. 5 are for the purpose of adjusting the RC modifier so that the operation point is at the center frequency of the dynamic range of the device.

The RC components in the ideal integrating and differentiating circuits illustrated in Figs. 2–5 are such that the two resistors $R_1$ and $R_2$ are equal and the two capacitors $C_1$ and $C_2$ are equal. Such values produced a circuit which was relatively simple to construct and, with the amplification factor $K=4$, provided optimum results. However, an ideal differentiating and integrating circuit may also be constructed with discrete values for $R_1$, $R_2$, $C_1$ and $C_2$. In such cases the amplification factor $$K=\left[\frac{R_1+R_2}{R_2}\right]\left[\frac{C_1+C_2}{C_2}\right]$$

for the ideal differentiating circuit and for the ideal integrating circuit $$K=\left[\frac{C_1+C_2}{C_1}\right]\left[\frac{R_1+R_2}{R_1}\right]$$

The value of K for the differentiating circuit is derived in the following manner. Assuming a voltage $e_2$ at the node of the circuit shown in Fig. 3, the nodal current equation in Laplacian operator form may be expressed as $$[e_2(s)-e_i(s)]C_1s+[e_2(s)-Ke_o(s)]C_2s+\frac{[e_2(s)-e_o(s)]}{R_1}=0 \qquad (10)$$

By combining like terms we have $$e_2(s)[R_1C_1s+C_2s)+1]-e_i(s)R_1C_1s-Ke_o(s)R_1C_2s-e_o(s)=0 \qquad (11)$$

and, since $$e_2(s)=\left[\frac{R_2}{R_1+R_2}\right]e_o(s) \qquad (12)$$

we can substitute the value of $e_2(s)$ of Equation 12 in Equation 11 and combine like terms so that we have $$e_o(s)[s\{R_1^2+R_1R_2)(C_1+C_2)-KR_1R_2C_2\}+R_1]=R_1R_2C_1se_i(s) \qquad (13)$$

From Equation 13 the transfer function is $$\frac{e_o(s)}{e_i(s)}=\frac{R_1R_2C_1s}{s[(R_1^2+R_1R_2)(C_1+C_2)-KR_1R_2C_2]+R_1} \qquad (14)$$

Now, when $$K=\left[\frac{R_1+R_2}{R_2}\right]\left[\frac{C_1+C_2}{C_2}\right]$$

then $$\frac{e_o(s)}{e_i(s)}=R_2C_1s$$

which is the transfer function of an ideal differentiator modified by $R_2C_1$.

In a similar manner, it can be shown that for the integrating circuit $$\frac{e_o(s)}{e_i(s)}=\frac{1}{R_1C_2s}$$

where $$K=\left[\frac{C_1+C_2}{C_1}\right]\left[\frac{R_1+R_2}{R_1}\right]$$

In both cases, it can be seen that when $R_1=R_2$ and $C_1=C_2$, then $K=4$.

While there has been described what is at present considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. An electrical integrating circuit comprising a source of input voltage, a first resistor and a first and second capacitor having the same capacitance value connected in series in that order across said source, means for deriving an output voltage across said second capacitor, and a regenerative feedback loop including an amplifier responsive to said output voltage and a second resistor connected between the output of said amplifier and the junction of said first resistor and said first capacitor, said amplifier being adapted to provide an amplification factor of 4 and said second resistor having the same resistance value as said first resistor.

2. An electrical differentiating circuit comprising, a source of input voltage, a first capacitor and a first and second resistor having the same resistance value connected in series in that order across said source, means for deriving an output voltage across said second resistor, and a regenerative feedback loop including an amplifier responsive to said output voltage and a second capacitor connected between the output of said amplifier and the junction of said first capacitor and said first resistor, said amplifier being adapted to provide an amplification factor of 4 and said second capacitor having the same capacitance value as said first capacitor.

3. In a two-terminal pair network having an input voltage applied to one terminal pair and having a first capacitor connected across the other terminal pair, means for deriving an output voltage across said first capacitor which is the integral of said input voltage comprising: a first resistor and a second capacitor in series connection in that order with said source and said first capacitor, said first and second capacitors being of equal value, an amplifier circuit responsive to said output voltage and including means whereby the output of said amplifier circuit is in phase with the input thereto, said amplifier circuit being adapted to provide an amplification factor of 4, and a second resistor, equal in value to said first resistor, connected between the output of said amplifier and the junction of said first resistor and said second capacitor.

4. In a two-terminal pair network having an input voltage applied to one terminal pair and having a first resistor connected across the other terminal pair, means for deriving an output voltage across said first resistor which is the derivative of said input voltage comprising: a first capacitor and a second resistor in series connection in that order with said source and said first resistor, said first and second resistors being of equal value, an amplifier circuit responsive to said output voltage and including means whereby the output of said ampilfier circuit is in phase with the input thereto, said amplifier circuit being adapted to provide an amplification factor of 4, and a second capacitor, equal in value to said first capacitor, connected between the output of said amplifier and the junction of said first capacitor and said second resistor.

5. An electrical integrating circuit comprising a source of input voltage, a first resistor and a first and second capacitor connected in series in that order across said source, said first and second capactiors being equal in value, a pair of output terminals connected across said second capacitor, a voltage amplifier circuit having its input connected to the junction of said first and second capacitors and including means whereby the amplified output of the amplifier is in phase with the input thereto, said amplifier circuit being adapted to provide an amplification factor of 4, and a second resistor equal in value to said first resistor connector between the output of said amplifier and the junction of said first resistor and said first capacitor.

6. An electrical differentiating circuit comprising a source of input voltage, a first capacitor and a first and second resistor connected in series in that order across said source, said first and second resistors being equal in value, a pair of output terminals connected across said second resistor, a voltage amplifier circuit having its input connected to the junction of said first and second resistors and including means whereby the amplified output of the amplifier is in phase with the input thereto, said amplifier being adapted to provide an amplification factor of 4, and a second capacitor equal in value to said first capacitor connected between the output of said amplifier and the junction of said first capacitor and said first resistor.

7. An electrical integrating circuit comprising a source of input voltage, a first resistor of value $R_1$ and a first and second capacitor of values $C_1$ and $C_2$, respectively, connected in series in that order across said source, means for deriving an output voltage across said second capacitor, and a regenerative feedback loop including an amplifier responsive to said output voltage and a second resistor of value $R_2$ connected between the output of said amplifier and the junction of said first resistor and said first capacitor, said amplifier being adapted to provide an amplification factor of $$K=\left[\frac{C_1+C_2}{C_1}\right]\left[\frac{R_1+R_2}{R_1}\right]$$

8. An electrical differentiating circuit comprising a source of input voltage, a first capacitor of value $C_1$ and a first and second resistor of values $R_1$ and $R_2$, respectively, connected in series in that order across said source, means for deriving an output voltage across said second resistor, and a regenerative feedback loop including an amplifier responsive to said output voltage and a second capacitor of value $C_2$ connected between the output of said amplifier and the junction of said first capacitor and said first resistor, said amplifier being adapted to provide an amplification factor of $$K=\left[\frac{R_1+R_2}{R_2}\right]\left[\frac{C_1+C_2}{C_2}\right]$$

9. Means for generating a voltage which is a mathematical function of a source of input voltage comprising: first, second and third impedances connected in series in that order across said input source, the second and third impedances being of equal value and having phase quadrature characteristics with respect to the first impedance, a pair of output terminals connected across said third impedance, a regenerative feedback loop coupled between the junction of said second and third impedances and the junction of said first and second impedances, said feedback loop comprising an amplifier circuit having its input connected to the junction of the second and third impedances and a fourth impedance, equal to and characterized by the same electrical parameters as that of said first impedance, connected between the output of said amplifier circuit and the junction of said first and second impedance, said amplifier circuit being adapted to provide an amplification factor of 4.

References Cited in the file of this patent

UNITED STATES PATENTS 2,767,255 Talamini -------------- Oct. 16, 1956

OTHER REFERENCES

"Applications Manual for Philbrick Octal Plug—In Computing Amplifiers," (Philbrick), published by George A. Philbrick Researchers, Inc., 1956, page 18 relied on.